(12) United States Patent
Dejima (10) Patent No.: US 10,998,698 B2
(45) Date of Patent: *May 4, 2021

(54) LIGHT SOURCE DEVICE

(71) Applicant: NICHIA CORPORATION, Anan (JP)

(72) Inventor: Norihiro Dejima, Yokohama (JP)

(73) Assignee: NICHIA CORPORATION, Anan (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/904,886

(22) Filed: Jun. 18, 2020

(65) Prior Publication Data

US 2020/0321752 A1 Oct. 8, 2020

Related U.S. Application Data

(63) Continuation of application No. 16/427,184, filed on May 30, 2019, now Pat. No. 10,727,648.

(30) Foreign Application Priority Data

May 31, 2018 (JP) .............................. JP2018-104572

(51) Int. Cl.
*H01S 5/40* (2006.01)
*H01S 5/0625* (2006.01)
*H01S 5/14* (2006.01)

(52) U.S. Cl.
CPC ........ *H01S 5/4012* (2013.01); *H01S 5/06255* (2013.01); *H01S 5/141* (2013.01); *H01S 5/4062* (2013.01)

(58) Field of Classification Search
CPC .... H01S 5/4062; H01S 5/4012; H01S 5/4087; H01S 5/141
See application file for complete search history.

(56) References Cited

U.S. PATENT DOCUMENTS 4,847,479 A 7/1989 Clark et al.
10,727,648 B2 * 7/2020 Dejima ................. H01S 5/4012
(Continued)

FOREIGN PATENT DOCUMENTS

JP 2003-324227 A 11/2003
JP 2011-205061 A 10/2011
(Continued)

OTHER PUBLICATIONS

Notice of Allowance on U.S. Appl. No. 16/427,184 dated Apr. 3, 2020.

*Primary Examiner* — Michael Carter
(74) *Attorney, Agent, or Firm* — Foley & Lardner LLP (57) ABSTRACT

A light source device includes: a plurality of laser light sources, each configured to emit a light beam; a plurality of collimating lenses, each configured to collimate the light beam emitted from a corresponding one of the laser light sources; a first transmission diffraction grating configured to diffract and combine, in an identical diffraction angle direction, the light beams transmitted through the collimating lenses and incident on a single region at different incident angles; a sensor configured to detect a positional deviation in diffracted light beams that are diffracted and combined by the first transmission diffraction grating; and a plurality of wavelength selecting elements, each disposed on an optical path between a respective one of the collimating lenses and the first transmission diffraction grating and configured to select a wavelength of a corresponding one of the light beams incident on the first transmission diffraction grating.

19 Claims, 4 Drawing Sheets

(56) References Cited

U.S. PATENT DOCUMENTS

| | | |
|---|---|---|
| 2003/0206336 A1 | 11/2003 | Onaka et al. |
| 2012/0012762 A1 | 1/2012 | Nowak et al. |
| 2016/0344162 A1 | 11/2016 | Konno et al. |
| 2019/0020178 A1 | 1/2019 | Oguri et al. |

FOREIGN PATENT DOCUMENTS

| | | |
|---|---|---|
| JP | 2015-051663 A | 3/2015 |
| WO | WO-2015/115301 A1 | 8/2015 |
| WO | WO-2017/134911 A1 | 8/2017 |

\* cited by examiner

LIGHT SOURCE DEVICE

CROSS-REFERENCE TO RELATED APPLICATIONS

The present application is a continuation of U.S. patent application Ser. No. 16/427,184, filed on May 30, 2019, which claims priority to Japanese Patent Application No. 2018-104572, filed on May 31, 2018. The contents of these applications are hereby incorporated by reference in their entireties.

BACKGROUND

The present disclosure relates to a light source device that emits higher-power laser light by wavelength beam combining (WBC).

In various fields including laser processing, demand for light source devices that emit high-power laser has been increasing. Examples of light source devices that emits high-power laser beam include a light source device employing wavelength beam combining (hereinafter may also be referred to as the "WBC device"). Examples of WBC devices include a wavelength-tunable light source device described in JP 2003-324227 A (see FIG. 8 in JP 2003-324227 A). In the wavelength-tunable light source device described in JP 2003-324227, light beams of different oscillation wavelengths, each emitted from a respective one of a plurality of semiconductor lasers, are combined using a diffraction grating. Furthermore, JP 2003-324227 A describes that a portion of the combined light beam is branched to be monitored, which allows feedback control of the arrangement angle of the combining diffraction grating and the emission angles of light beams from the semiconductor lasers.

SUMMARY

However, using a portion of the combined light beam for monitoring leads to partial loss of the output light.

An object of the present invention is to provide a light source device in which a positional deviation in combined light can be detected without affecting the combined light.

A light source device according to one embodiment of the present invention includes: a plurality of laser light sources each configured to emit a light beam; collimating lenses each configured to collimate the light beam emitted from a corresponding one of the laser light sources so as to be substantially parallel to an optical axis of the laser light source; a first transmission diffraction grating configured to diffract and combine, in an identical diffraction angle direction, the light beams transmitted through corresponding ones of the collimating lenses and incident on a single region at different incident angles; a sensor configured to detect a positional deviation in diffracted light beams that are diffracted and combined by the first transmission diffraction grating; and wavelength selecting elements each disposed on an optical path between a respective one of the collimating lenses and the first transmission diffraction grating and configured to select a wavelength of a corresponding one of the light beams incident on the first transmission diffraction grating. The sensor is configured to detect the diffracted light beams transmitted through the first transmission diffraction grating. The diffracted light beams reflected by the first transmission diffraction grating is outputted.

A light source device including a sensor in which a positional deviation in combined light can be detected without affecting the combined light can be provided.

DETAILED DESCRIPTION OF EMBODIMENTS

With reference to the drawings, certain embodiments of the present invention will be described below.

First Embodiment

Figure 1:
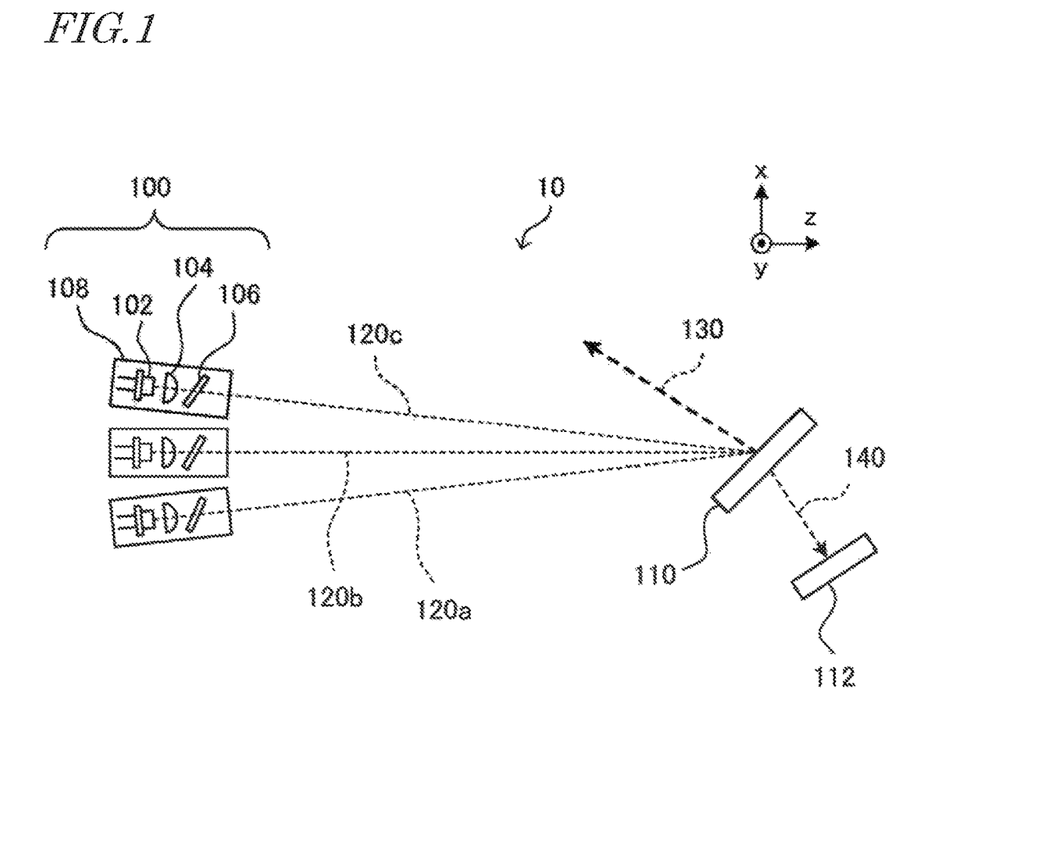
FIG. 1 is a schematic view of a light source device according to a first embodiment of the present invention.

FIG. 1 is a schematic view of a light source device according to a first embodiment of the present invention. A light source device 10 according to the present embodiment includes a plurality of light source modules 100, a first transmission diffraction grating 110, and a sensor 112. Each of the light source modules 100 includes a laser light source 102, a collimating lens 104, a second transmission diffraction grating 106, and a stage 108. In each light source module 100, the laser light source 102, the collimating lens 104, and the second transmission diffraction grating 106 are provided on or in some connection with the same stage 108, so that the module can be collectively moved. In this case, the laser light source 102 is preferably disposed in contact with the stage 108, allowing the laser light source 102 to be cooled by cooling the stage 108.

FIG. 1 shows, for the sake of convenience, the x-axis, the y-axis, and the z-axis being perpendicular to one another. In FIG. 1, broken lines schematically represent light beams. An incident light beam 120a, an incident light beam 120b, and an incident light beam 120c that are represented by the broken lines are emitted from their respective laser light sources 102, pass through their respective collimating lenses 104 and second transmission diffraction gratings 106, and are incident on the first transmission diffraction grating 110. Although each of the beams is a light beam having an angle of divergence or a width, the optical axis of each light beam is shown by a broken line in FIG. 1 for the sake of convenience.

As shown in FIG. 1, in the present embodiment, the incident light beam 120a, the incident light beam 120b, and the incident light beam 120c are incident on the first transmission diffraction grating 110 at different incident angles. In the present specification, when indicating an incident light beam that need not be specified, or when indicating all of the incident light beams, any such incident light beam(s) may simply be referred to as the "incident light beam(s) 120". All of the optical axes of the incident light beams 120 are on the same xz-plane.

The laser light source 102 may be a laser diode (hereinafter referred to also as the "LD") having, for example, a peak wavelength in a range of 350 nm to 550 nm, and having a predetermined gain spectrum width. For example, the laser light source 102 may be an LD including a nitride semiconductor to emit light with a central wavelength of 410 nm and having a gain spectrum width ΔΛ of 20 nm. In this case, the wavelength range of light emitted from the laser light source 102 is from 400 nm to 420 nm. More specifically, the laser light source 102 is configured to emit a light beam having a wavelength within a predetermined gain spectrum width (e.g., 400 nm to 420 nm). The wavelength is selected from within the gain spectrum of the light source 102 through external resonance with the second transmission diffraction grating 106.

When the light emission side of the LD, which is the laser light source 102, is the front side, and the side opposite thereto is the rear side, the front side is preferably provided with anti-reflection coating in order to reduce reflectance to approximately 0%, for example, approximately 0.1% to 2.0%. A mirror on the rear side preferably has a reflectance of substantially 100%, for example, a reflectivity in a range of 85% to 99.9%. An LD to emit light in a wavelength range of 350 nm to 550 nm is easily deteriorated in the atmosphere and, therefore, the laser light source 102 is preferably hermetically sealed. For example, the laser light source 102 may be a CAN-packaged LD. The laser light source 102 being a CAN-packaged LD further exhibits a cooling effect, and an effect of blocking static electricity and electromagnetic waves. For the LD to output light having a wavelength in a range of 350 nm to 550 nm, a nitride semiconductor can be used.

Each collimating lens 104 collimates the light emitted from the corresponding laser light source 102 to be substantially parallel to the optical axis of the laser light source 102. Each collimating lens 104 corresponding to a respective one of the laser light sources 102 may be a single lens, or a combination lens being a combination of a plurality of lenses.

Each second transmission diffraction grating 106 is disposed on the optical path between the collimating lens 104 and the first transmission diffraction grating 110 in a respective light source module 100. Each second transmission diffraction grating 106 diffracts a portion of light emitted from the laser light source 102 in a respective light source module 100 to return toward the laser light source 102, causing external resonance between the laser light source 102 and the second transmission diffraction grating 106. More specifically, external resonance occurs between the rear side of the LD, which is the laser light source 102, and the second transmission diffraction grating 106. That is, each laser light source 102, a respective collimating lens 104, and a respective second transmission diffraction grating 106 form a single external cavity. The external cavity may be in the Littrow configuration. The Littrow configuration refers to a configuration in which the diffraction angle and the incident angle are identical to each other, and the reflected diffracted light is fed back to the light source along the route identical to that of the incident light.

Figure 2:
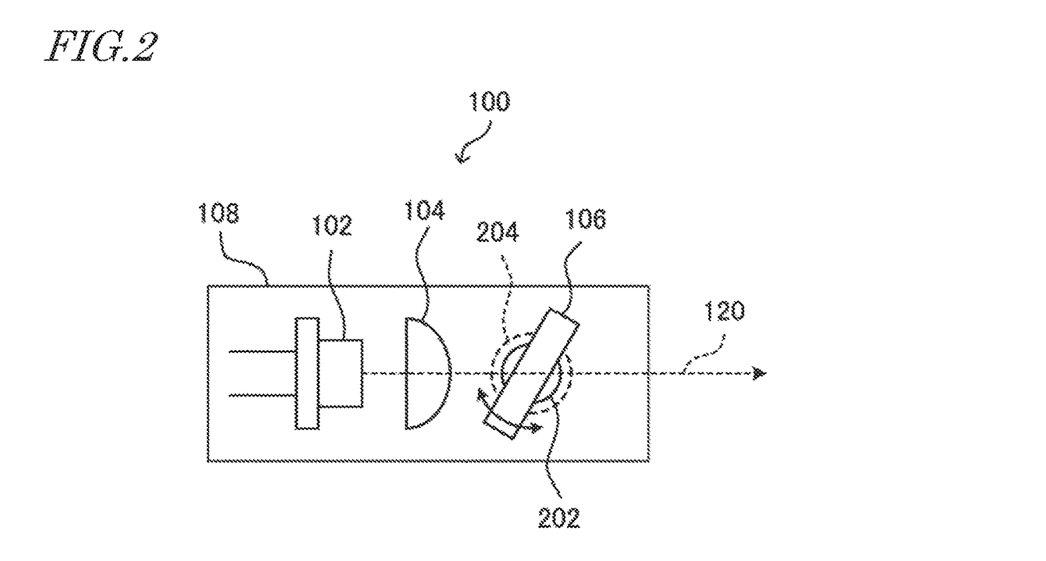
FIG. 2 is a schematic enlarged view of a light source module 100 shown in FIG. 1.

FIG. 2 is a schematic enlarged view of each light source module 100 shown in FIG. 1. The second transmission diffraction grating 106 is disposed such that a grating groove direction thereof is oriented in parallel to the y-axis shown in FIG. 1. The second transmission diffraction grating 106 has a rotation axis 202 parallel to the y-axis. The second transmission diffraction grating 106 can be rotated with respect to the stage 108 about the rotation axis 202. When the second transmission diffraction grating 106 is rotated about the rotation axis 202, the arrangement angle of the second transmission diffraction grating 106 with respect to the laser light source 102 is changed. This operation allows for changing the incident angle of the light emitted from the laser light source 102 on the second transmission diffraction grating. Accordingly, the wavelength of the incident light beam 120 transmitted through the second transmission diffraction grating 106 and the incident light beam 120 on the first transmission diffraction grating 110 can be selected (changed). That is, each second transmission diffraction grating 106 serves as a wavelength selecting element of a respective external cavity.

As shown in FIG. 2, the light source module 100 may be provided with an element driver 204, so as to control the rotation of the second transmission diffraction grating 106. The element driver 204 may be a driving means known in the art such as a stepping motor. For the sake of convenience, in the present specification, light emitted from the laser light source 102 and transmitted through the second transmission diffraction grating 106 (the incident light beam 120) may be referred to also as "a light emitted from the light source module 100" or "a light emitted from the external cavity". The incident angle at which the incident light beam 120 is incident on the first transmission diffraction grating 110 is determined by the arrangement angle of the external cavity that causes the external resonance. More specifically, by selecting the position and angle of each light source module 100 with respect to the first transmission diffraction grating 110, the incident angle of the incident light beams 120 can be selected and adjusted.

The first transmission diffraction grating 110 is disposed such that a grating groove direction thereof is oriented in parallel to the y-axis shown in FIG. 1. The incident light beam 120a, the incident light beam 120b, and the incident light beam 120c that have been transmitted through respective collimating lenses 104 and respective the second transmission diffraction gratings 106 of respective corresponding light source modules 100 are incident on a single region of the first transmission diffraction grating 110, and are diffracted by the first transmission diffraction grating 110 at an identical diffraction angle and combined, so that a reflected diffracted light beam 130 is formed. The light source device 10 outputs the reflected diffracted light beam 130 in which a plurality of diffracted light beams are combined. Next, with reference to FIG. 3, a description will be given of the state of diffraction, reflection, and transmission of light with the first transmission diffraction grating 110.

Figure 3:
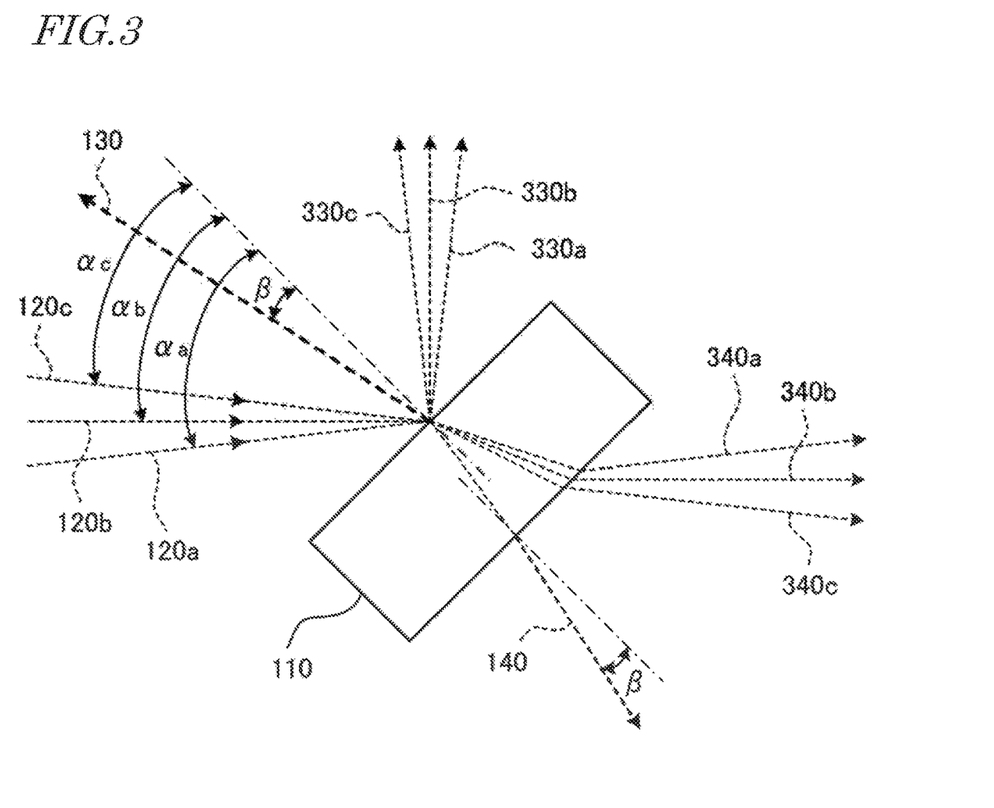
FIG. 3 is a view describing the state of diffraction, reflection, and transmission of light at a transmission diffraction grating.

FIG. 3 is a view describing the state of diffraction, reflection, and transmission of light at the first transmission diffraction grating 110. The dash-dotted line in FIG. 3 represents the normal of the first transmission diffraction grating 110. As shown in FIG. 3, when the incident light beam 120a, the incident light beam 120b, and the incident light beam 120c each having been emitted from a respective one of the light source modules 100 are incident on the first transmission diffraction grating 110, the reflected diffracted light beam 130, a transmitted diffracted light beam 140, a reflected light beam 330a, a reflected light beam 330b, a reflected light beam 330c, a transmitted light beam 340a, a transmitted light beam 340b, a transmitted light beam 340c and the like are obtained.

The reflected diffracted light beam 130 is first-order diffracted light reflected by the first transmission diffraction grating 110. The transmitted diffracted light beam 140 is first-order diffracted light transmitted through the first transmission diffraction grating 110. The reflected light beam 330a, the reflected light beam 330b, and the reflected light beam 330c are zero-order light reflected by the first transmission diffraction grating 110, and correspond to the incident light beam 120a, the incident light beam 120b, and the incident light beam 120c, respectively. The transmitted light beam 340a, the transmitted light beam 340b, and the transmitted light beam 340c are zero-order light transmitted through the first transmission diffraction grating 110, and correspond to the incident light beam 120a, the incident light beam 120b, and the incident light beam 120c, respectively. Second or higher-order diffracted light may also be generated, but are not shown in FIG. 3 because of having very low intensity. Furthermore, in a strict sense, the incident light beams 120a, 120b, and 120c do not coincide with one another when transmitted through the first transmission diffraction grating 110 to form first-order diffracted light beams. However, the first-order diffracted light beams are transmitted through the first transmission diffraction grating 110 at an identical diffraction angle $\beta$, and thus collimated. Therefore, in FIG. 3, the transmitted diffracted light beam 140 is indicated by one optical axis for the sake of simplicity.

In FIG. 3, "αa", "αb", and "αc" represent the incident angles of the incident light beam 120a, the incident light beam 120b, and the incident light beam 120c, respectively. "$\beta$" represents the diffraction angle of the first-order diffracted light. The optical axes of the reflected diffracted light beam 130, the transmitted diffracted light beam 140, the reflected light beam 330a, the reflected light beam 330b, the reflected light beam 330c, the transmitted light beam 340a, the transmitted light beam 340b, and the transmitted light beam 340c are also on the xz-plane, similarly to the optical axes of the incident light beam 120a, the incident light beam 120b, and the incident light beam 120c (see FIG. 1).

The sensor 112 is configured to detect the position of the transmitted diffracted light beam 140 having been transmitted through the first transmission diffraction grating 110, thus to detect a positional deviation of the reflected diffracted light beam 130. The sensor 112 may include one or more light receiving elements. Examples of light receiving elements include a photodiode, a CMOS, a CCD and the like. In particular, a photodiode is preferably used for the light receiving element. Using the photodiode allows for providing the sensor 112 at a low cost. The sensor 112 may be formed of a plurality of light receiving elements or a single light receiving element. The sensor 112 including a plurality of light receiving elements allows for facilitating to determine the direction of the positional deviation in the diffracted light. The sensor 112 including a single light receiving element allows reduction in costs of the light source device.

Figure 4:
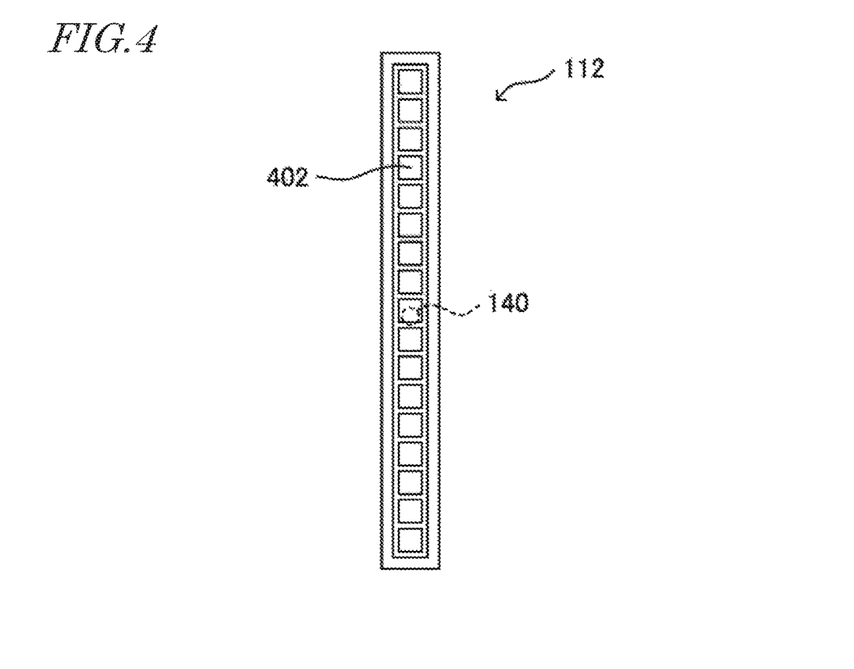
FIG. 4 is a schematic view of a linear sensor including a plurality of photodiodes.

FIG. 4 is a schematic view of a linear sensor including a plurality of photodiodes. As shown in FIG. 4, the sensor 112 may be a linear sensor in which a plurality of light receiving elements are arranged in a line. In the sensor 112 shown in FIG. 4, a plurality of photodiodes 402 are arranged in a line. The sensor 112 is disposed so that the light receiving surface of the sensor 112 is perpendicular to the optical axis of the transmitted diffracted light beam 140 while facing the transmitted diffracted light beam 140, and so that the central axis of the direction in which the plurality of photodiodes 402 are arranged (the upper-lower direction in FIG. 4) is on the xz-plane where the transmitted diffracted light beam 140 exists (see FIG. 1). Thus, as shown in FIG. 4, the sensor 112 can receive the transmitted diffracted light beam 140.

With each laser light source disposed so that a corresponding incident light beam 120 is incident at the correct angle, the sensor 112 can detect the transmitted diffracted light beam 140 at the position corresponding to a predetermined diffraction angle. When all of the incident light beams 120 are diffracted by an identical diffraction angle, the diffracted beams are coaxially combined and, therefore, the reflected diffracted light beam 130 with a small beam parameter product (BPP) can be obtained. Meanwhile, when the incident angle of any one of the incident light beams 120 is deviated, the transmitted diffracted light beam 140 shifts in the upper-lower direction in FIG. 4 with respect to the sensor 112, or the shape of the beam is expanded in the upper-lower direction in FIG. 4. Thus, the sensor 112 detects the positional deviation in the transmitted diffracted light beam 140. When the incident angle of the incident light beam 120 is deviated, the position of the reflected diffracted light beam 130 is also deviated, similarly to the transmitted diffracted light beam 140. Therefore, detecting the positional deviation in the transmitted diffracted light beam 140 allows for also detecting the positional deviation in the reflected diffracted light beam 130.

When the sensor 112 detects the positional deviation in the light diffracted by the first transmission diffraction grating 110, adjusting the angle of the second transmission diffraction grating 106 to change the wavelength of light incident on the first transmission diffraction grating 110 allows for correcting the positional deviation of the diffracted light of the first transmission diffraction grating 110. This will be described below with a specific example.

When the incident angle of the incident light beam 120 incident on the first transmission diffraction grating 110 is α and the diffraction angle of the light diffracted by the first transmission diffraction grating 110 is $\beta$, the relationship of Equation 1 is satisfied:

$$\sin \alpha + \sin \beta = N \cdot m \cdot \lambda \qquad \text{Equation 1}$$

where N is the number of grooves per a length of 1 mm in the first transmission diffraction grating 110, which is a combining diffraction grating, m is the order of diffraction, and λ is the wavelength of light.

For example, the first order diffraction is discussed, assuming that each laser light source 102 emits a laser beam having a central wavelength of 410 nm and has a wavelength range of 400 nm to 420 nm, and the number of grooves per a length of 1 mm in the first transmission diffraction grating 110 is 2222. In this case, laser beams with the wavelength λ and at the incident angle α in combinations shown in Table 1 are diffracted at the identical diffraction angle $\beta$ and are combined to produce a combined beam.

TABLE 1

| wavelength λ (nm) | incident angle α (degrees) | diffraction angle $\beta$ (degrees) |
| --- | --- | --- |
| 402.93 | 43.74 | 11.77 |
| 405.30 | 44.16 | 11.77 |
| 407.66 | 44.58 | 11.77 |
| 410.00 | 45.00 | 11.77 |
| 412.32 | 45.12 | 11.77 |
| 414.63 | 45.84 | 11.77 |
| 416.92 | 46.26 | 11.77 |

For example, the angle of the second transmission diffraction grating 106 of each light source module 100 shown in FIG. 1 is adjusted so that the incident light beam 120a, the incident light beam 120b, and the incident light beam 120c have wavelengths of 414.63 nm, 410.00 nm, and 405.30 nm, respectively. Furthermore, the position of each light source module 100 is adjusted so that the incident light beam 120a (see FIG. 3) has an incident angle αa of 45.84 degrees, the incident light beam 120*b* has an incident angle α*b* of 45.00 degrees, and the incident light beam 120*c* has an incident angle α*c* of 44.16 degrees. Then, all of the light beams emitted from the light source modules 100 are diffracted at an identical diffraction angle β of 11.77 degrees by the first transmission diffraction grating 110, so that the high-power reflected diffracted light beam 130 is formed. At this time, the transmitted diffracted light beam 140 is also formed. The sensor 112 can detect the position of the transmitted diffracted light beam 140. All of the incident light beams 120 are diffracted by an identical diffraction angle and are combined coaxially, so that the light source device 10 can output a high-quality light beam.

While the above description illustrates that the incident light beam 120*a* having a wavelength of 414.63 nm is incident at the predetermined incident angle of 45.84 degrees, a case will now be considered where incident light with a wavelength of 414.63 nm from actual light source modules 100*a* is incident at an incident angle of 46.26 degrees. In this case, the diffraction angle β of the first-order diffracted light of the incident light beam 120*a* calculated using Equation 1 is 11.47 degrees, which is different from the predetermined value of 11.77 degrees. With such a diffraction angle β, the diffracted light combined by the first transmission diffraction grating 110 (the reflected diffracted light beam 130 and the transmitted diffracted light beam 140) fails to be coaxial and the BPP of the combined beam is increased, resulting in poor quality. As described above, it is not easy to precisely adjust the light source modules 100 in trying to adjust the incident angle α to be a proper angle while irradiating one portion of the first transmission diffraction grating 110, which is the combining diffraction grating, with a laser light beam. Thus, it is considered difficult to correct such a deviation in the incident angle by adjusting the angle of the light source modules 100.

On the other hand, in the light source device 10 according to the present embodiment, each light source module 100 includes the second transmission diffraction grating 106 serving as a wavelength selecting element. When the sensor 112 detects a deviation in the diffracted light, the angle of the second transmission diffraction grating 106 can be adjusted for each light source module 100. In the light source device 10 according to the present embodiment, changing the wavelength of the incident light beam 120*a*, which is incident on the first transmission diffraction grating 110 at an incident angle of 46.26 degrees, to 416.92 nm enables an adjustment of the diffraction angle of the diffracted light of the incident light beam 120*a* from 11.47 degrees to 11.77 degrees. Thus, tolerance of positional deviations in the light source module 100, which is difficult to adjust in position, can be increased.

Furthermore, the light source device 10 according to the present embodiment does not require devices such as a beam analyzer or a spectrum analyzer, which have high-performance and are expensive, so that the light source device 10 according to the present embodiment can have a simple structure, and increase in cost can be reduced. Furthermore, the sensor 112 is generally provided in the light source device 10. Therefore, when the incident angle is deviated due to some factor after shipment of the light source device 10, the sensor 112 can immediately detect a positional deviation in the diffracted light.

In view of its function, the first transmission diffraction grating 110 preferably allows to pass a smaller amount of light as a transmitted light beam and reflects a greater amount of light as a reflected light beam. This is different from the second transmission diffraction grating 106, which is also a transmission diffraction grating. The first transmission diffraction grating 110 has a transmittance with respect to the zero-order light lower than a transmittance of the second transmission diffraction grating 106 with respect to the zero-order light. For example, the ratio of the reflected diffracted light beam 130 (i.e., the reflected first-order diffracted light) outputted from the first transmission diffraction grating 110 (i.e., the reflectance of the first transmission diffraction grating 110 with respect to the first-order diffracted light) may be in a range of 70% to 99%, preferably in a range of 85% to 99%. The ratio of the transmitted diffracted light beam 140 (i.e., the transmitted first-order diffracted light), that is, the transmittance with respect to the first-order diffracted light, may be in a range of 0.1% to 10%, preferably in a range of 0.1% to 5%. The ratio of the transmitted zero-order light (i.e., the transmittance with respect to the zero-order light) may be in a range of 0.1% to 10%, preferably in a range of 0.1% to 5%. For example, for the first transmission diffraction grating 110, a transmission diffraction grating having a reflectance of 97% of the first-order diffracted light, a transmittance of 1% of the first-order diffracted light, and a transmittance of 1% of the zero-order light of may be used.

The second transmission diffraction grating 106 preferably allows to pass a greater amount of light as a transmitted light beam and reflects a smaller amount of light as a reflected light beam. The second transmission diffraction grating 106 has a transmittance with respect to the zero-order light higher than the transmittance of the first transmission diffraction grating 110 with respect to the zero-order light. For example, the ratio of the zero-order light transmitted through the second transmission diffraction grating 106 (i.e., transmittance of the second transmission diffraction grating 106 with respect to the zero-order light) may be in a range of 60% to 90%, preferably in a range of 73% to 83%.

The ratio of the reflected first-order diffracted light (i.e., the reflectance with respect to the first-order diffracted light) may be in a range of 10% to 30%, preferably in a range of 15% to 25%. The ratio of the transmitted first-order diffracted light (the transmittance with respect to the first-order diffracted light) may be in a range of 0.1% to 5%, preferably in a range of 0.1% to 2%. For example, for the second transmission diffraction grating 106, a transmission diffraction grating having a transmittance with respect to the zero-order light of 78%, a reflectance with respect to the first-order diffracted light of 20%, a transmittance with respect to the first-order diffracted light of 1% may be used.

With the light source device according to the present embodiment having a structure as described above, when the sensor receives a transmitted diffracted light beam, the degree of combining of output light can be evaluated using the positional deviation in the transmitted diffracted light beam that does not contribute to output. This allows for reducing loss of the output light.

Furthermore, branching of the output light is not necessary when detecting a positional deviation, so that an optical element necessary for the branching is not disposed. This allows for reducing deterioration in beam quality.

Furthermore, employing the transmission diffraction grating for the combining diffraction grating allows for reducing light absorption by the diffraction grating, so that deterioration of the diffraction grating can be reduced. When using a reflective diffraction grating provided with a metal film at a light incident surface, the reflective diffraction grating absorbs light, which may lead to deterioration of the reflective diffraction grating.

Second Embodiment

Figure 5:
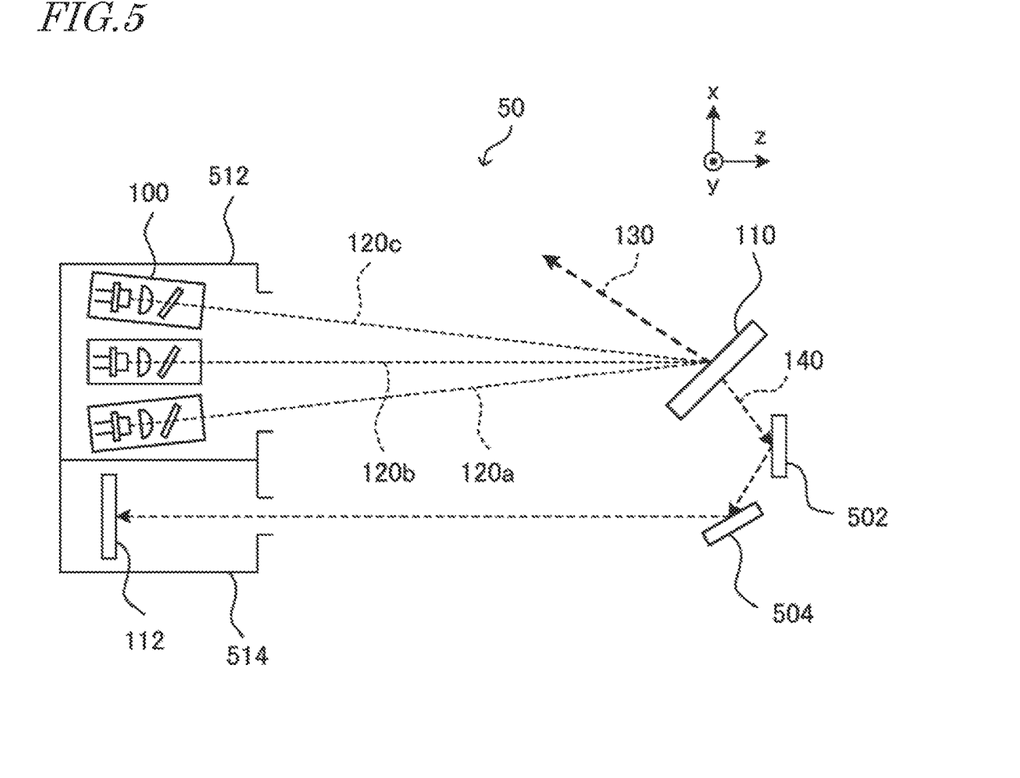
FIG. 5 is a schematic view of a light source device according to a second embodiment of the present invention.

FIG. 5 is a schematic view of a light source device according to a second embodiment of the present invention. A light source device 50 according to the present embodiment is a modification of the light source device 10 according to the first embodiment. In the present embodiment, components, members, parts, devices, and/or elements having the same functions as those in the first embodiment are denoted by the same reference characters as those in the first embodiment, and the description thereof may be omitted.

The light source device 50 is different from the light source device 10 mainly in that the sensor 112 is disposed adjacent to the laser light sources 102, and the transmitted diffracted light beam 140 transmitted through the first transmission diffraction grating 110 is guided to the sensor 112 by a mirror 502 and a mirror 504.

As shown in FIG. 5, the light source modules 100 are preferably provided with a light source cover 512. With the sensor 112 being disposed adjacent to the laser light sources 102, effects as described below can be further obtained. Using a portion of the light source cover 512, a sensor cover 514 can be easily provided. When the sensor 112 is provided with the sensor cover 514, noise of light in the surrounding can be blocked, so that accuracy in detection of the sensor 112 can be improved. While the sensor 112 disposed near the first transmission diffraction grating 110 is easily influenced by stray light attributed to the zero-order light transmitted through the first transmission diffraction grating 110, when the sensor 112 is disposed adjacent to the laser light sources 102, the sensor 112 can be prevented from being influenced by such stray light. Furthermore, the distance between the first transmission diffraction grating 110 and the sensor 112 can be increased, allowing the deviation in the diffracted light to be noticeable, so that accuracy in detection can be increased.

Figure 6:
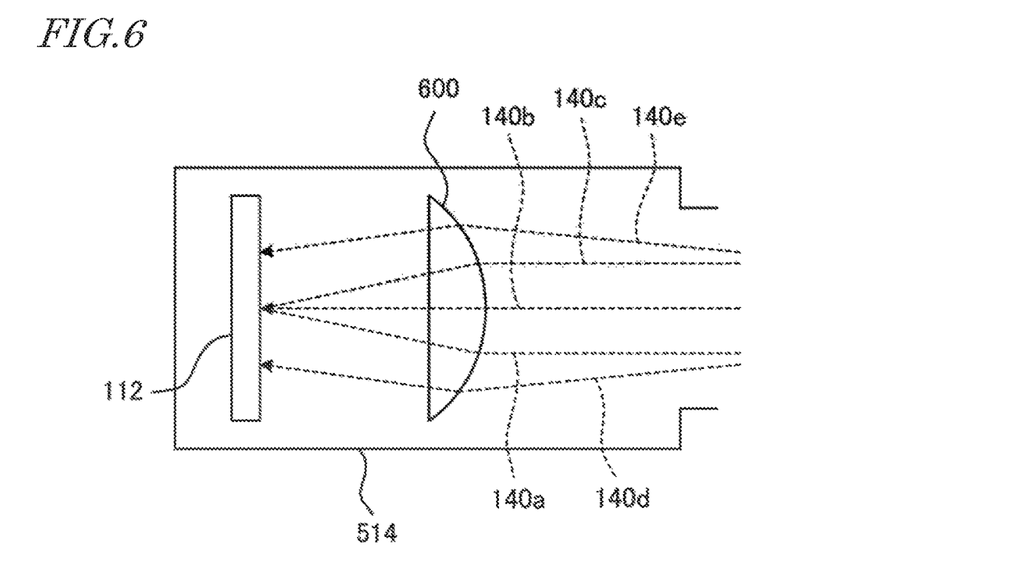
FIG. 6 is a view of a sensor and a condenser lens provided in front of the sensor.

FIG. 6 is a view of the sensor 112 and a condenser lens provided in front of the sensor 112. As shown in FIG. 6, a condenser lens 600 may be further disposed on the optical path of light becoming incident on the sensor 112. In this case, the sensor 112 is disposed at the rear focal plane of the condenser lens 600. The optical axis of the condenser lens 600 is aligned with a desired optical axis of the transmitted diffracted light beam 140. In FIG. 6, in order to describe the effect of the condenser lens 600, the transmitted diffracted light beam 140 is shown as a beam that has a certain width. As represented by broken lines, the transmitted diffracted light beam 140 includes transmitted diffracted light beams 140a, 140b, 140c, 140d, and 140e. The transmitted diffracted light beam components 140a, 140b, and 140c are collimated light components which are parallel to a desired optical axis of the transmitted diffracted light beam 140, and the transmitted diffracted light beam components 140d and 140e are components with deviated diffraction angles due to deviations in the incident angle of the incident light beam 120.

As shown in FIG. 6, while the transmitted diffracted light beam components 140a, 140b, and 140c that are parallel to a desired optical axis of the transmitted diffracted light beam 140 are condensed at one point by the condenser lens 600, the transmitted diffracted light beam components 140d and 140e that are not parallel to a desired optical axis of the transmitted diffracted light beam 140 cannot be condensed to the same point. That is, with the condenser lens 600, deviated diffracted light components and diffracted light components not being deviated can be separated from each other among the transmitted diffracted light beam 140, so that, accuracy in detection of the sensor 112 can be further improved.

Third Embodiment

Figure 7:
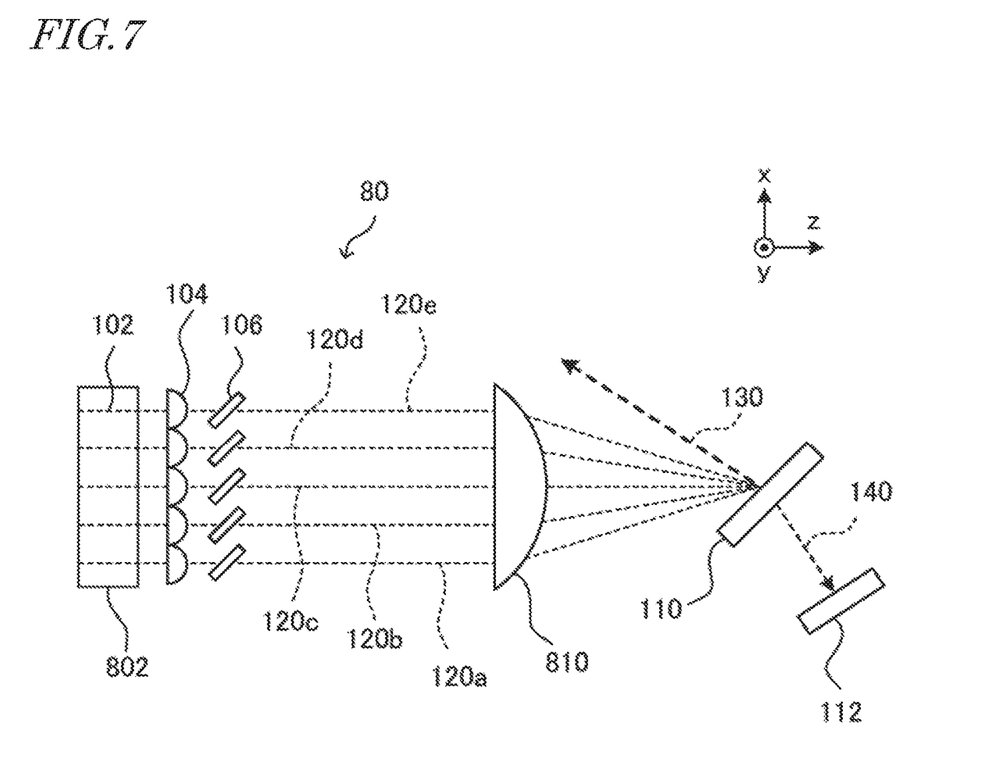
FIG. 7 is a schematic view of a light source device according to a third embodiment of the present invention.

FIG. 7 is a schematic view of a light source device according to a third embodiment of the present invention. A light source device 80 according to the present embodiment is a modification of the light source device 10 according to the first embodiment. In the present embodiment, components, members, parts, devices, and/or elements having the same functions as those in the first embodiment are denoted by the same reference characters as those in the first embodiment, and the description thereof may be omitted.

The light source device 80 is different from the light source device 10 mainly in configurations described below. Each laser light source 102 is a laser diode forming a laser diode bar 802. In the laser diode bar 802 a plurality of (e.g., five in the example in FIG. 7) laser diodes are arranged in an array in the x-axis direction on the same substrate. In FIG. 7, the laser light sources 102, which are laser diodes, are indicated by broken lines representing waveguides corresponding to the laser light sources 102. A deflection condenser lens 810 is disposed on the optical path between the second transmission diffraction gratings 106 and the first transmission diffraction grating 110.

The incident light beam 120a, the incident light beam 120b, the incident light beam 120c, the incident light beam 120d, and the incident light beam 120e transmitted through the second transmission diffraction grating 106 and emitted from each external cavity propagate parallel to one another to the deflection condenser lens 810 in the z-axis direction shown in FIG. 7. The incident angle at which each incident light beam 120 is incident on the first transmission diffraction grating 110 is determined by the deflection condenser lens 810. That is, the incident light beam 120 emitted from each external cavity is incident on the first transmission diffraction grating 110 at a proper incident angle determined by the deflection condenser lens 810. The incident light beams 120 are diffracted by the first transmission diffraction grating 110 at the identical diffraction angle and combined, to form the reflected diffracted light beam 130 and the transmitted diffracted light beam 140.

In the present embodiment, a lens array in which a plurality of collimating lenses, each of which corresponding to a corresponding one of the laser diodes of the laser diode bar 802, are integrated may be used for the collimating lens 104. The laser diode bar 802 including a plurality of laser light sources 102 is preferably hermetically sealed. For example, the entirety of the laser diode bar 802 may be hermetically sealed.

As in the light source device 10, the sensor 112 detects the position of the transmitted diffracted light beam 140. Accordingly, as in the light source device 10, the light source device 80 according to the present embodiment can detect positional deviation (i.e., deviation in diffraction angle) of the diffracted light using the sensor 112. Further, by adjusting the angle of the second transmission diffraction grating 106, the positional deviation in the diffracted light can be easily corrected.

While certain embodiments of the present invention has been described above, the technical scope of the present invention is not limited to the description of the embodiments illustrated above. It is to be understood that various other embodiments and variants within the scope and spirit of the invention may occur to those skilled in the art, and such other embodiments and variants are intended to be covered by the following claims. For example, the embodiments described above is described in detail for ease of understanding of the present invention, and the present invention is not limited to those including all of the structures described above.

Some of the configurations in the described embodiments may be replaced by other configurations, or may be eliminated. Furthermore, some of the configurations in some embodiments may be added to configurations in other embodiments. For example, in the first and third embodiments, as in the second embodiment, the condenser lens 600 may be further disposed on the optical path of light to be incident on the sensor 112.

What is claimed is:

1. A light source device comprising:
a plurality of laser light sources, each configured to emit a light beam, the plurality of laser light sources being provided with a light source cover;
a plurality of collimating lenses, each configured to collimate the light beam emitted from a corresponding one of the laser light sources;
a first transmission diffraction grating configured to diffract and combine the light beams transmitted through the collimating lenses and incident on a single region at different incident angles in an identical diffraction angle direction;
a sensor configured to detect a positional deviation in the diffracted and combined light beams transmitted through the first transmission diffraction grating; and
a plurality of wavelength selecting elements, each disposed on an optical path between a respective one of the collimating lenses and the first transmission diffraction grating and configured to select a wavelength of a corresponding one of the light beams incident on the first transmission diffraction grating.

2. The light source device of claim 1, wherein:
the sensor and the wavelength selecting elements are configured such that, when the sensor detects a positional deviation in one or more of the diffracted light beams transmitted through the first transmission diffraction grating, an angle of a corresponding one or more of the wavelength selecting elements is adjusted to change a wavelength of the light beams to be incident on the first transmission diffraction grating in order to correct the positional deviation in the one or more of the diffracted light beams transmitted through the first transmission diffraction grating.

3. The light source device of claim 2, further comprising:
a mirror,
wherein the sensor is disposed adjacent to the laser light sources, and
wherein the mirror is configured to guide the diffracted light transmitted through the first transmission diffraction grating to the sensor.

4. The light source device of claim 3, further comprising: a sensor cover for the sensor.

5. The light source device of claim 4, further comprising:
a condenser lens disposed on an optical path of light to be incident on the sensor,
wherein the sensor is disposed on a rear focal plane of the condenser lens.

6. The light source device of claim 3, wherein:
each of the wavelength selecting elements is a second transmission diffraction grating,
a transmittance of the second transmission diffraction grating with respect to zero-order light is higher than a transmittance of the first transmission diffraction grating with respect to zero-order light, and
the light source device further comprises a plurality of element drivers, each configured to change an arrangement angle of a respective one of the second transmission diffraction gratings with respect to a corresponding one of the laser light sources, to change the wavelength of the light beam to be incident on the first transmission diffraction grating.

7. The light source device of claim 6, wherein:
the sensor is a linear sensor in which a plurality of light receiving elements are arranged in an array.

8. The light source device of claim 6, wherein:
the sensor is a single light receiving element.

9. The light source device of claim 6, further comprising:
a condenser lens disposed on an optical path of light to be incident on the sensor,
wherein the sensor is disposed on a rear focal plane of the condenser lens.

10. The light source device of claim 1, wherein:
the plurality of laser light sources are separated from the sensor by at least a portion of the light source cover.

11. The light source device of claim 10, further comprising:
a mirror,
wherein the sensor is disposed adjacent to the laser light sources, and
wherein the mirror is configured to guide the diffracted light transmitted through the first transmission diffraction grating to the sensor.

12. The light source device of claim 10, further comprising:
a condenser lens disposed on an optical path of light to be incident on the sensor,
wherein the sensor is disposed on a rear focal plane of the condenser lens.

13. The light source device of claim 1, wherein:
each of the wavelength selecting elements is a second transmission diffraction grating,
a transmittance of the second transmission diffraction grating with respect to zero-order light is higher than a transmittance of the first transmission diffraction grating with respect to zero-order light, and
the light source device further comprises a plurality of element drivers, each configured to change an arrangement angle of a respective one of the second transmission diffraction gratings with respect to a corresponding one of the laser light sources, to change the wavelength of the light beam to be incident on the first transmission diffraction grating.

14. The light source device of claim 1, wherein:
the sensor comprises a plurality of light receiving elements.

15. The light source device of claim 14, wherein:
the sensor is a linear sensor in which the light receiving elements are arranged in an array.

16. The light source device of claim 1, wherein:
the sensor is a single light receiving element.

17. The light source device of claim 1, further comprising:
a condenser lens disposed on an optical path of light to be incident on the sensor,
wherein the sensor is disposed on a rear focal plane of the condenser lens.

18. The light source device of claim 1, wherein:
each of the laser light sources comprises a nitride semiconductor, and
the laser light sources are hermetically sealed.

19. The light source device of claim 1, wherein:
the laser light sources are laser diodes forming a laser diode bar, and
an incident angle of each of the light beams incident on the first transmission diffraction grating is defined by a deflection condenser lens disposed on an optical path between the wavelength selecting element and the first transmission diffraction grating.

\* \* \* \* \*